US010226133B2

(12) United States Patent
Katz

(10) Patent No.: US 10,226,133 B2
(45) Date of Patent: Mar. 12, 2019

(54) AUDIO HEADBOARD

(71) Applicant: Robert Katz, Montreal (CA)

(72) Inventor: Robert Katz, Montreal (CA)

(73) Assignee: Robert Katz, Montreal (CA)

( * ) Notice: Subject to any disclaimer, the term of this patent is extended or adjusted under 35 U.S.C. 154(b) by 166 days.

(21) Appl. No.: 14/383,828

(22) PCT Filed: Mar. 7, 2013

(86) PCT No.: PCT/CA2013/000205
§ 371 (c)(1),
(2) Date: Sep. 8, 2014

(87) PCT Pub. No.: WO2013/131175
PCT Pub. Date: Sep. 12, 2013

(65) Prior Publication Data
US 2015/0128343 A1    May 14, 2015

Related U.S. Application Data

(60) Provisional application No. 61/634,898, filed on Mar. 8, 2012.

(51) Int. Cl.
*A47C 21/00*       (2006.01)
*A47C 19/02*       (2006.01)
(Continued)

(52) U.S. Cl.
CPC .......... *A47C 21/003* (2013.01); *A47C 19/022* (2013.01); *A47C 19/122* (2013.01);
(Continued)

(58) Field of Classification Search
CPC ..... A47C 21/003; A47C 19/22; A47C 19/022; H03G 5/165; H04R 1/025; H04R 1/028
See application file for complete search history.

(56) References Cited

U.S. PATENT DOCUMENTS 3,376,585 A * 4/1968 Muzaurieta .......... A47C 21/003
5/694
3,384,719 A * 5/1968 Lanzara ................. H04R 5/023
381/151
(Continued)

FOREIGN PATENT DOCUMENTS

JP           04260299 A  *  9/1992
WO    WO 2004107806 A1 * 12/2004

*Primary Examiner* — Robert G Santos
*Assistant Examiner* — David R Hare
(74) *Attorney, Agent, or Firm* — Robert Brouillette; Brouillette Legal Inc.

(57) ABSTRACT

An audio bed board having an inertial type acoustics transducer is disclosed. The novel bed board structure is capable of emitting sound without any exposed audio speakers or speaker openings allowing sound to escape. The bed board typically acts as an audio emitter. In a preferred embodiment, the bed board is generally hollow thereby allowing the installation of the acoustic elements within the bed board. Additionally, an audio amplifier contained therein may be coupled to the headboard, other bed structures or surrounding structures. The bed board generally has a surface adjacent one of head end and foot end having no normally apparent openings so as to facilitate cleaning of the bed board. Furthermore, the emitted sound signal may utilize multiple audio sources for reproduction by the bed board sound system including but not limited to digital, analog, optical and emergency signals.

16 Claims, 6 Drawing Sheets

(51) Int. Cl.
  *A47C 19/12* (2006.01)
  *H03G 5/16* (2006.01)
  *H04R 1/02* (2006.01)
(52) U.S. Cl.
  CPC ............ *H03G 5/165* (2013.01); *H04R 1/025* (2013.01); *H04R 1/028* (2013.01)

(56) References Cited

U.S. PATENT DOCUMENTS

| | | | | |
|---|---|---|---|---|
| 3,660,591 | A * | 5/1972 | Schultz | A47C 21/00 174/70 R |
| 3,934,284 | A * | 1/1976 | Paletta | A47G 1/02 5/280 |
| 4,023,566 | A * | 5/1977 | Martinmaas | H04R 5/023 181/199 |
| 4,109,331 | A * | 8/1978 | Champeau | A47C 21/00 5/284 |
| 4,124,249 | A * | 11/1978 | Abbeloos | A47C 21/003 297/217.4 |
| 4,507,816 | A * | 4/1985 | Smith, Jr. | A47C 21/003 381/151 |
| 4,660,561 | A * | 4/1987 | Nielsen | A61N 5/0614 248/325 |
| 4,683,888 | A * | 8/1987 | Kramer | A61N 5/0614 455/344 |
| 5,101,810 | A * | 4/1992 | Skille | A61H 23/0236 5/904 |
| 5,216,769 | A * | 6/1993 | Eakin | A47C 20/04 5/174 |
| 5,442,710 | A * | 8/1995 | Komatsu | A61H 1/005 381/162 |
| 6,493,888 | B1 * | 12/2002 | Salvatini | A61G 1/00 5/423 |
| 6,585,515 | B1 * | 7/2003 | Roy | G09B 9/00 434/55 |
| 6,904,154 | B2 * | 6/2005 | Azima | B42D 15/022 29/594 |
| 6,953,439 | B1 * | 10/2005 | Kabemba | A61H 23/0236 5/904 |
| 6,984,057 | B1 * | 1/2006 | Rogers | A47B 81/06 362/125 |
| 7,127,075 | B2 * | 10/2006 | Park | A47C 21/006 381/151 |
| 7,236,601 | B1 * | 6/2007 | Bachmann | H04R 7/045 381/152 |
| 7,685,661 | B2 * | 3/2010 | Popilek | A47G 9/1045 381/301 |
| 7,869,903 | B2 * | 1/2011 | Turner | G08B 25/008 5/2.1 |
| 9,204,219 | B2 * | 12/2015 | McCarty | H04R 5/023 |
| 2006/0050904 | A1 * | 3/2006 | Metheringham | H04R 1/24 381/162 |
| 2006/0093165 | A1 * | 5/2006 | Kamimura | H04R 7/045 381/152 |
| 2007/0086612 | A1 * | 4/2007 | Nishibori | A47C 21/003 381/333 |
| 2008/0137883 | A1 * | 6/2008 | Araki | H04M 1/605 381/107 |
| 2009/0126287 | A1 * | 5/2009 | Meres | E04B 9/001 52/144 |
| 2009/0147965 | A1 * | 6/2009 | Kuo | A47C 21/003 381/71.6 |
| 2009/0175484 | A1 * | 7/2009 | Saint Vincent | G10K 11/178 381/388 |
| 2009/0177327 | A1 * | 7/2009 | Turner | A47C 21/003 700/275 |
| 2013/0272557 | A1 * | 10/2013 | Ozcan | G06F 1/1637 381/333 |

* cited by examiner

AUDIO HEADBOARD

RELATED APPLICATION

This application claims priority to the U.S. Provisional Application Ser. No. 61/634,898, filed Mar. 8, 2012, entitled "AUDIO HEADBOARD".

FIELD OF THE INVENTION

The present invention relates generally to furniture, namely bed boards (headboard and/or footboard) used for beds whereby the bed board is transformed into a multi-functional audio signal emitter for various purposes.

BACKGROUND OF INVENTION

Bed headboards have been in use for hundreds of years. A common definition is "a board or panel that often forms the head, as of a bed." A footboard is the equivalent at the foot of the bed. In the context of a headboard for a bed, they typically are a planar element which helps form the structure of a bed frame. Often the headboard is used to form a back support if a user is to sit up while in bed.

Headboards and general bed frame structures have also been used to as a vehicle to carry more complex electronic devices for hospital environments or residential environments. Some of the cited prior art accomplishes additional tasks with their headboards such as appending external arms and other supports for hanging speakers and microphones such as Welling et al U.S. Pat. No. 5,592,153, or Moster et al. U.S. Pat. No. 6,781,517 which demonstrates externalized audio communication devices external to the bed frame or structure and affixed to adjustable arms. The bed headboard environment has also been used to house retractable televisions such as Jones U.S. Pat. No. 5,054,139 and Kirchner et al. U.S. Pat. No. 7,864,512 which demonstrate retractable flat panel television screens. Other electronic technologies integrated into bed furniture include vibrating massage integrated apparatuses. In Hernandez et al. U.S. Pat. No. 7,835,529, noise canceling electronics have also been adjoined or in proximity to bed furniture in order to quieten a sleeper's environment. U.S. Pat. No. 5,647,633 Fukuoka, exhibits a vibrating furniture in the form of a seat to alert and waken an automobile driver if they become drowsy. Kondo et al U.S. Pat. No. 7,833,072 provide for a seat controlled by actuators which are able to physically move and vibrate the seat in the context of a user viewing a movie accompanied by sound so as to have the user feel they are part of the scene they are viewing. In this fashion the user experience is enhanced by corporal displacement by the cited apparatus. None of these prior art inventions contemplate the novel elements of the invention defined in this patent.

SUMMARY OF THE INVENTION

In the present invention a new and novel embodiment is contemplated for specific use in the bed environment such as but not limited to hotel suites which have become increasingly sensitive to the pleasure of their guests' experience. At least one inertial acoustic actuator is affixed adhesively, mechanically or both, to any one of the surfaces of the headboard or footboard. For the purposes of simplicity, when the novel embodiments are referenced hereinbelow in relation to a headboard, the reference can be exchanged for the footboard of the bed.

The headboard panels to which the inertial acoustic actuator is affixed to, are transformed into large surface acoustic radiators where no single focused audio point source is present. An inertial acoustic actuator vibrates at audio frequencies in reciprocating strokes of very small amplitude thus creating the bending waves in the substrate. The bending waves are induced into the panel or "substrate" whereby all audio frequencies are heard where the bending waves are present, unlike conventional cone type speakers. This way, a user may receive full audio spectrum acoustic content regardless of their positioning relative to the headboard.

On cruise liners, ship bourn bedrooms and suites as well as any other bedroom environments where the user may want to experience music or audio content such as that which is related but not limited to viewing audio visual media, paging messages, emergency alerts or telephony. All of these applications would benefit from this novel means by way of focusing the acoustic output adjacent to the user and controlling stray sound within the suite whether it be ship based, land based or other. An additional benefit is the room may be filled with the audio content more evenly as compared to conventional cone type speakers as the headboard acts as an acoustic planar radiator. The benefit of this over conventional cone type speakers is planar sound waves fills the rooms or space at lower decibel levels local to the emission source, with full coverage as it is not a point source but a large planar acoustic radiator. By way of example, a small fraction of the overall acoustic energy enters the ear canal when the ear is in proximity to a large acoustic radiator, where a cone speaker is in fact a very concentrated point source where if the ear canal is in proximity to the speaker, as would be the case of a user lying on a bed, will be subject to a very large amount of acoustic energy and would be uncomfortable if not damaging to the user. Therefore when a person is very close to the audio emitting source and if said source is a planar emitter created by an inertial acoustic actuator, the person can listen comfortably without being aggressed by a point source.

A further benefit is, planar acoustic radiators driven by inertial acoustics transducers penetrate at least two times the acoustic near field distance or effective sound field distance, compared to cone type acoustic emitters. Cone speakers effective sound field diminish at a rate of 1/d squared where d is the distance from the speaker, whereby planar acoustic emitters loose acoustic energy at a rate of 1/d. This increases the utility of the headboard whereby it could create a comfortable sound field when the user is very close to the headboard and still be able to be used to fill the room with sound at somewhat similar sound pressure levels.

Health care environments would also benefit from the novel means cited herein so as to generate sound local to the patients in the bed, yet would vastly improve hygienic maintenance of the bed apparatus as no perforations or complex ancillary devices or structures are required as seen in some of the cited prior art. Hospital environments have been under attack by aggressive viruses including but not limited to Clostridium Difficile. Sterilizing the bed and surrounding structures when a bed is turned over to a new patient has become an accepted protocol in many parts of the world. Appended speakers as well as other apparatuses cause the act of sterilization to be difficult if not impossible. The inertial acoustic actuator as cited in the description of the novel embodiment herein may be affixed to the substrate on the inside wall of the headboard if the headboard is fabricated with an internal cavity able to house the inertial acoustic actuator as no openings are required to let sound pass through as is the case with conventional cone type speakers. In new designs for headboards using the novel inventions herein described used in environment such as but not limited to healthcare environments, create visually inconspicuous and sterilizable means to create sound and are preferred over externalized conspicuous functioning elements as cited in Welling et al U.S. Pat. No. 5,592,153, or Moster et al. U.S. Pat. No. 6,781,517.

The novel means described in this invention relate to creating an audio emitting means by way of causing the actual headboard material to be transformed into a radiating audio emitting device. This solves several problems in a novel fashion related to the listening of audio content by users in a bed as will be described hereinbelow. Further, in ship bourn environments, or in other environments such as but not limited to hotels the vessels' or hotels' insurance underwriters do require that the users sleeping in the bed are able to be addressed with an emergency audio signal so as to wake and prompt the sleeping individuals to evacuate their rooms and possibly the ship in the case of an emergency. In some jurisdictions, the legal requirement is to generate an audio emergency signal at a required decibel level measured at the sleeping users' head area, which is adjacent to the headboard. Having the headboard become the audio source would be favorable over existing emergency paging systems when considering the sound is measured at the persons head when they are lying in the bed. Standard emergency paging audio systems are separate stand alone systems typically far from the user's head this requiring additional power to fill the room with sound in order to achieve the desired decibel level, thus adding infrastructure cost as well as additional installation costs. The invention contemplated herein creates a novel means to add this utility without altering the outward appearance of the headboard.

The invention contemplated herein can also amalgamate the audio entertainment system with the headboard. As an option, this same system can be coupled with the emergency paging system so as reduce the required infrastructure. The audio headboard's proximity to the users head allows dedicated control of the volume of the sound signal as the audio reception area is proximal to the emitting area.

As the planar wave generated by affixing inertial acoustic actuators to a headboard propagate sound much deeper into the room space as compared to conventional cone type speakers, the audio headboard contemplated herein would offer great advantage to fill the room with audio as compared to conventional cone speakers due to its sound propagation attributes. Consumer electronic devices such as but not limited to light emitting diode televisions generate only marginal fidelity sound as their physical thickness does not have much depth for larger cone speakers which could sound better than small thinner speakers. The audio content from the television can be enhanced if the audio signal is used as the audio content for the audio headboard. It would equally bring the sound in close proximity to the listener. Over all sound would be less than if the television would have to drive sound in to the environment.

To satisfy the need to generate audio content in environments such as hotels or other conventional freestanding speakers are less practical than that of the audio headboard described herein as conventional free standing speakers occupy space within the room, and can be vandalized, stolen or damaged as they are exposed. Conventional cone type speakers built into the wall ("inwall speakers") are impractical, as they spread sound unevenly. As in wall speakers emit sound as a point source in space and their drivers have conical geometry, they project high frequency sound in a beaming fashion as high frequency sound is very directional. This would have the effect of not equally impact two users sitting on a bed as each would hear the sound emitted in a biased fashion due to their asymmetrical positioning. Conventional in wall cone type speakers also may contaminate an adjacent room with the sounds they are reproducing as wall construction may not impede all sound from being transmitted to the adjacent room. The audio headboard system described allows full decoupling of the audio system from demising walls between bedroom suites or other rooms as the headboard can stand off of the wall by a small amount of space to decouple it from the wall. Further, the use of one or more inertial type audio actuators in the headboard will cause the headboard to become a very large acoustic radiator, distributing the sound evenly to one or more users positioned in the bed, or in the room due to its sound propagation pattern. Acting as a very large acoustic radiator, the local decibel output at any one point of the headboard is much lower than a point source cone type speaker, lowering decibel output of stray sound into the room as well as generating a more even distribution of sound and more comfortable volume levels for users local to the audio headboard or further a field within the room.

The novel means as described herein utilize inertial type audio actuators as opposed to conventional cone type speakers to cause the actual material of the headboard to be transformed into an audio speaker. Inertial type audio actuators have been used in the past to excite substrates causing them to act as very large audio emitters as the large surfaces of the substrate may be caused to vibrate at audio frequencies, thus emitting desired audio content. As the headboard is local to the user if they are lying down on the bed, and in actual contact with the user if they are sitting up with their back against the headboard, this would optimize the acuity of the audio output. No holes are need to be pierced in the headboard to allow sound to escape as is the case with conventional cone type speakers, this would allow the novel audio output technologies cited herein to be less cumbersome than conventional speakers affixed to the bed frame by adjustable arms or speakers embedded in the frame structure with holes pierced to allow sound to be emitted. In the hospital environment, the lack of complex suspension structures or holes pierced to allow for a speaker grill using conventional cone type speakers also permits sterilization and cleaning of the bed environment in health care facilities to be vastly improved in that the headboard has fewer or no significant germ entrapment zones due to its flat uninterrupted surface and the facility of cleaning same.

In healthcare facilities, the bed structures and supporting bed apparatuses in the vicinity of the bed may include panels hosting various medical analysis and patient support equipment. These panels are found typically at the head of the bed functioning as a headboard or monitoring centre, and by way of this would benefit form the novel inventions found in this patent. The invention utilizing inertial type acoustic actuators would permit a substrate used in the patient bed apparatus to have no openings, and would facilitate sanitizing, cleaning and maintenance. Glass, polymer sheet or other substrate materials may be contemplated.

Sound source content can be supplied to the inertial type audio actuator by way of a signal being either local to the inertial type audio actuator, or amplified externally to the room and supplied using wireless technology or via wires such as but not limited to conventional speakers wires, CAT 5 or CAT 6 wires, or digital optical audio cables. Audio source signals can equally be supplied to the audio amplifier wirelessly using radio frequency technologies. A local audio amplifier affixed to, or embedded in the headboard, or in the vicinity thereof can equally amplify the audio signal so as to cause the headboard to function as an audio emitter. The substrates may vary from one headboard design to another. The source signal being fed to one or more inertial type acoustic actuators can be modified to compensate for any acoustic resonance inherent to the headboard apparatus it is adjoined to. The amplifier used to amplify the source signal has a digital sound processor integrated to it which is capable of pre-distorting the audio signal before transmitting it to the inertial type audio actuators affixed to the headboard substrate. While the inertial audio actuator or actuators are installed to the headboard apparatus, pink or white noise (full audio spectrum content) would be sent to the inertial audio actuators and the emitted sound would be measured by a microphone feeding the signal to audio analysis software. The digital sound processor then can be tuned typically using parametric equalization or other like means to compensate and attenuate any resonance frequencies that the headboard and bed apparatus acting as a soundboard would then emit. The digital sound processor is then programmed with the modified equalization parameters so as to pre-distort any source signal sent to the headboard audio system and in doing so reproduce the audio source content with the best fidelity possible as any resonances would be attenuated or removed.

So as to decouple the vibrating headboard audio apparatus from walls within the headboard's proximity, the bed frame structure including the headboard audio system can be placed a short distance from the wall if the entire bed apparatus is free standing. If the headboard is to be wall mounted and then the bed brought within proximity of the headboard, then the headboard audio apparatus may be affixed to the wall with small surface area fasteners using a visco elastomeric or like dampening interface so as to impede vibration from being transmitted from the headboard audio system to the wall. This has the effect of impeding sound transmission from being transferred to the wall and then to adjacent rooms.

An additional feature of the headboard audio system is the user can receive vibratory information related to the audio content. Lower frequency audio content causes the headboard substrate to vibrate a small amount as induced by the inertial type audio actuator. When the user leans up against the headboard while seated in bed, they can receive vibratory sensory information related to the audio content. In the case of headboards used as an audio output means for entertainment in the bedroom, hotel suite, or ship board suite, transmitting these vibrational signals which allow the users to better sense the audio content.

The prior art cited hereinabove all tend to relate to either visual media such as but not limited to a television, or externalized conventional cone type audio speakers being places on external arms or proximate to the user conspicuously attached to the bed frame but not embedded therein as illustrated in this invention. Other cited massage bed inventions relate to physical massage generated by motors causing the bed mattress to transmit vibration to the user only for this purpose only.

Objects of the Invention

It is an object of this invention to invent novel means to create a bed board structure which is capable of emitting sound without any exposed audio speakers or speaker openings allowing sound to be escape.

It is further an object of this invention to provide an audio emergency warning signal produced by a bed board.

It is further an object of this invention to create an audio entertainment system by way of a bed board.

It is also an object of this invention to provide a means to cause the bed board of a bed to become a means to generate music, paging messages, telephony, as well as other audio signals by way of an embedded audio system.

It is equally an object of this invention to provide a means to cause an audio bed board to be tuned by pre-distorting the audio signal being delivered to the inertial audio actuators so as to remove inherent audio resonances so as to optimize audio signal output.

It is further an object of this invention to provide means for utilizing multiple audio sources for reproduction by the bed board sound system including but not limited to digital, analog, optical and emergency signals.

It is further an object of this invention to provide a novel means to permit the user to experience vibratory effects of the audio source which enhance the perception of bass response and content of the audio bed board system.

It is an object of this invention to cause an inertial type audio actuator to couple with a bed board which bed board may use a variety of materials or substrates.

It is also an object of this invention to provide means for the audio bed board to be decoupled acoustically from an adjacent wall so as to limit the transmission of acoustic vibration to said wall.

It is further an object of this invention to provide a means for a bed board equipped with audio means to be cleaned and disinfected within a health care environment thoroughly and easily.

It is further an object of this invention to provide a means for a bed board to become an acoustic radiator whereby most or all of the frontal surface of the bed board become a very large audio emitter without the negative effects of a acoustic point source.

It is further an object of this invention to generate sound in a room in a way to limit the effects of transmitting sound to adjacent rooms.

It is further an object of this invention to cause the headboard or footboard to contain medical analysis and patient support equipment as part of the headboard or footboard.

DETAILED DESCRIPTION OF PREFERRED EMBODIMENT

Figure 1:
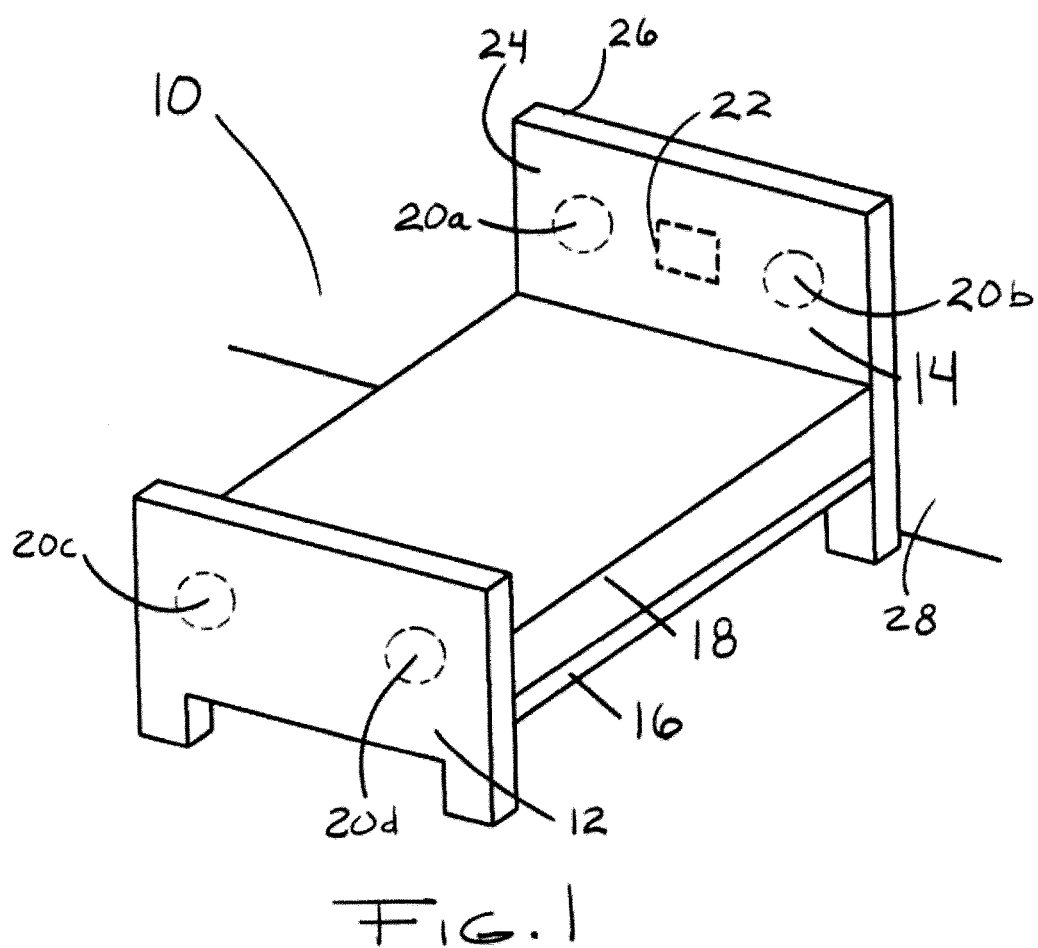
FIG. 1 is a perspective view of the bed apparatus.

A perspective view of the present invention is illustrated in FIG. 1. The illustration presents the present invention of the bed apparatus 10 having a bed structure comprising of a footboard 12, a novel headboard 14, a bed structure 16 and a mattress 18. Mounted behind the front face substrate 24 of the headboard 14 at least one inertial type acoustic actuator 20 and 20a which are mounted adhesively, mechanically or by other like means. Also mounted behind the front face substrate 24 of the headboard 14 is at least one audio amplifier 22. The headboard may optionally be constructed with a back substrate 26 which would make the headboard have a hollow section. The bed is typically located in proximity to a wall 28.

Figure 2:
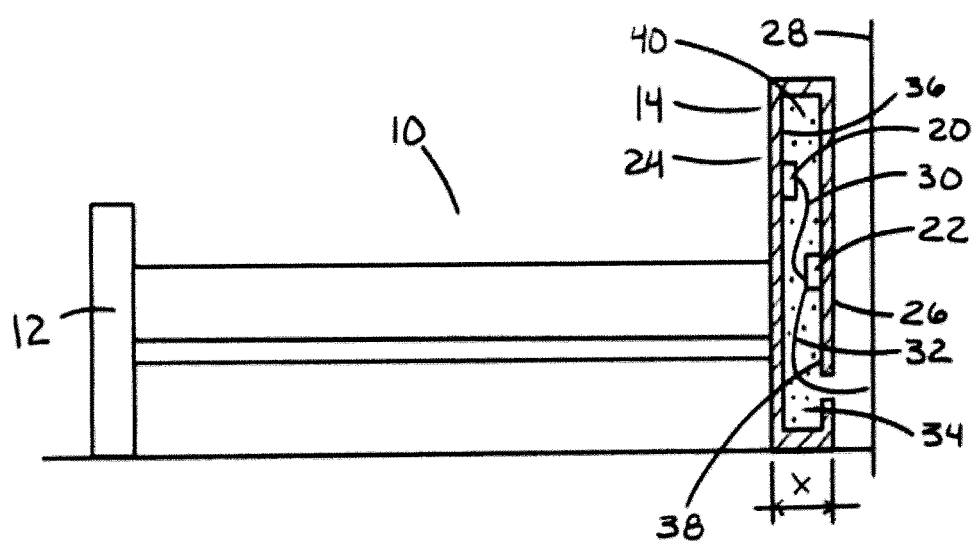
FIG. 2 is a side view of the bed apparatus with a cross section view of the headboard.

FIG. 2 illustrates a side view of the bed apparatus 10 and section view of the headboard 14. The inertial acoustic actuator(s) 20 is affixed typically to the front substrate 24 on its inside surface 36, but can be installed on other headboard surfaces such as the inside surface of the back 38 wall of a hollow headboard. The amplifier 22 may be affixed on the inside back wall 38 of the headboard 14 within the hollow cavity 34 or on the inside surface 36, or on other available surfaces of the bed 14 or surrounding area if desired. The cavity 34 may be filled with fiberglass or mineral wool 40 or other like acoustic air chamber filling materials. The amplifier 22 is connected to the inertial acoustic actuator(s) 20 by way of speaker wire 30, and the amplifier's 22 power and audio signal sources may be linked to power or audio signal source by way of cable(s) 32. The bed headboard is characterized by thickness "X".

Figure 3:
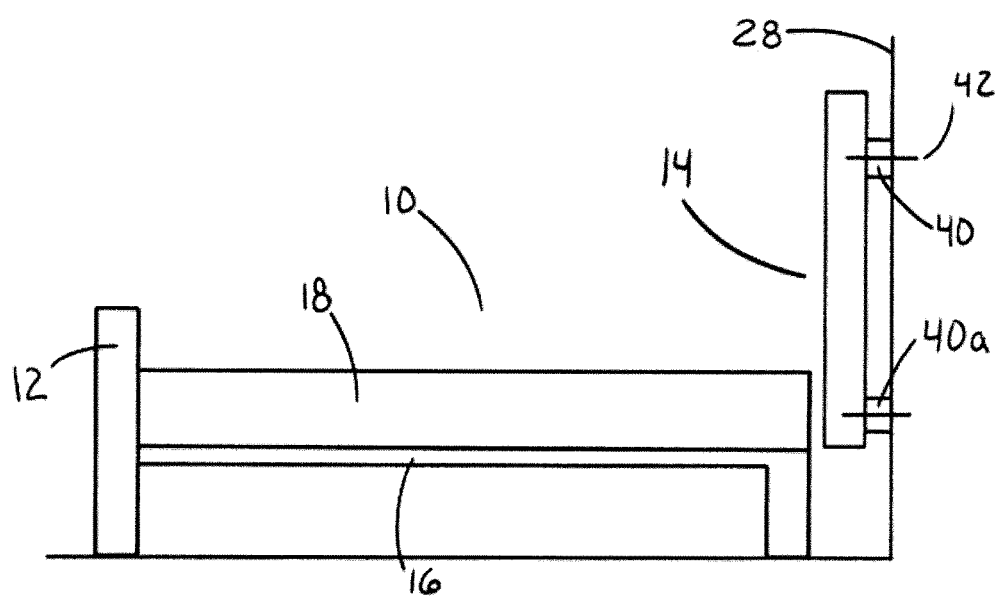
FIG. 3 is a side view of an alternate bed apparatus.

Referring to FIG. 3, the bed apparatus 10 may alternatively include a bed headboard which is affixed to the adjacent wall 28 by way of mechanical means such as screws 42 or other fastening means whereby the headboard is decoupled acoustically from the wall using acoustically damping pads 40 and 40a, using a material such as but not limited to a visco elastic rubber or other like substances. The bed is supported by the bed structure 16 or may alternatively be affixed to the wall 28 at the head end of the bed or the headboard affixed to the wall 28.

Figure 4:
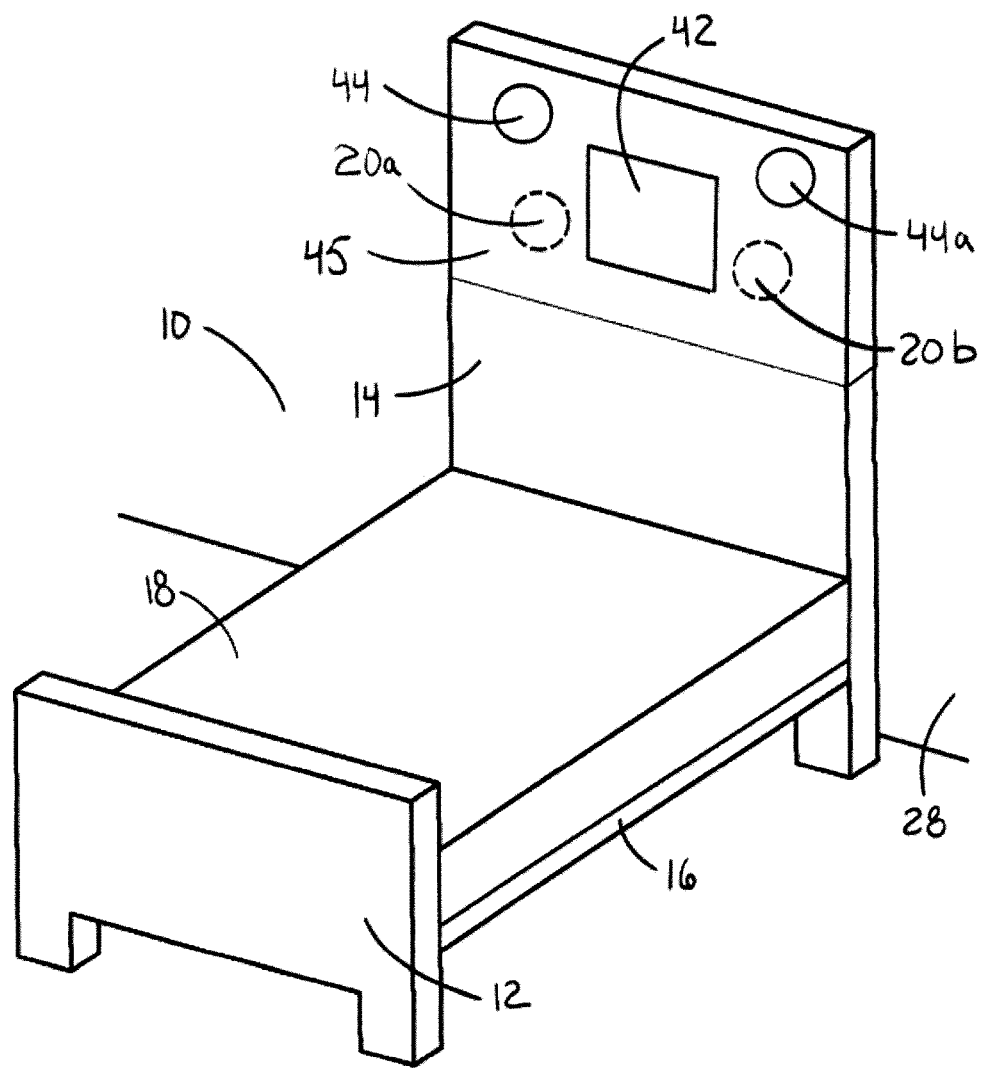
FIG. 4 is a perspective side view of a bed apparatus.

Now referring to FIG. 4, the bed apparatus 10 comprising of headboard 14 may alternatively include an extended portion 45 of the headboard 14. This extension 45 exhibits the same novel features of the headboard 14 in FIG. 2 and FIG. 3, but may also include a display screen 42, lights 44 and 44a. The display screen may be a patient monitoring system in healthcare applications which can be built into the headboard extension 45. Other subsystems, such as but not limited to medical or otherwise may also be integrated in to the headboard 14 and, or headboard extension 45.

Figure 5:
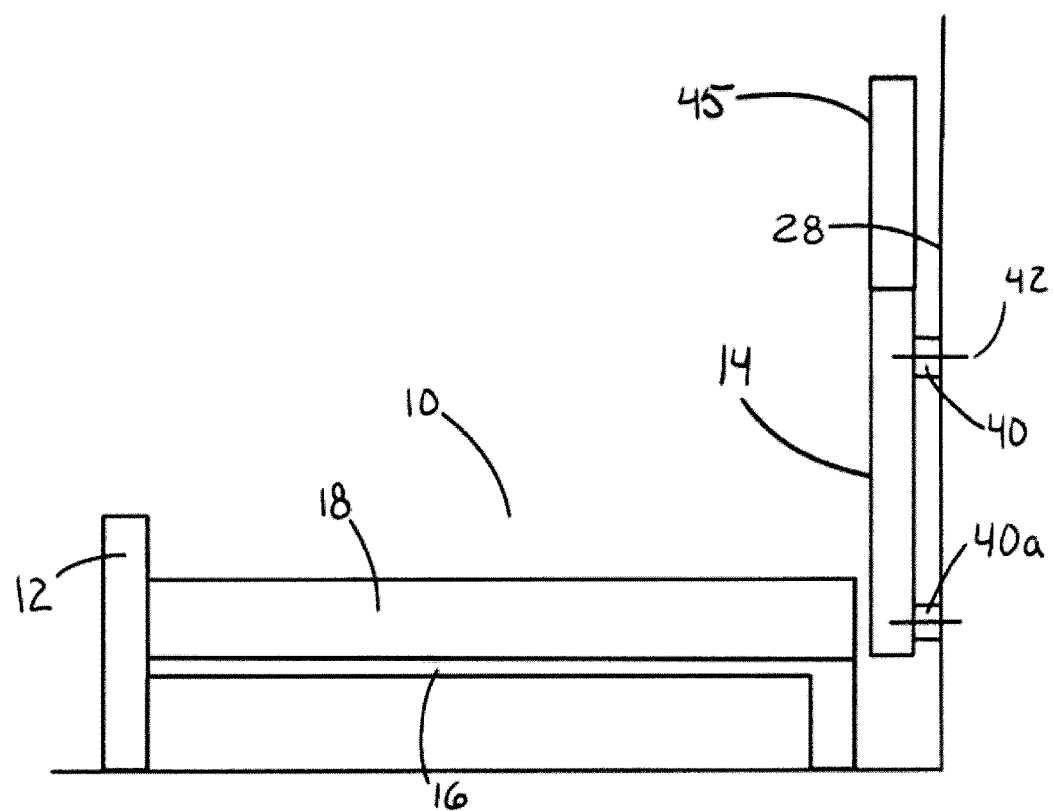
FIG. 5 is an side view of an alternate bed apparatus

FIG. 5 exhibits the same headboard extension as described in FIG. 4, however the headboard would be affixed to the adjacent wall 28 in the same manner as described hereinabove.

As all materials have a resonance frequency, if this frequency falls within the audio spectrum and forms part of the bed apparatus including the headboard structures a dissonant sounds can result if excited by the inertial type acoustic actuator. The audio amplifier 22 shown in FIGS. 1 and 2 may be configured to effectively pre-distort the audio signal so as to attenuate these resonance frequencies output from the inertial acoustic transducers 20a, 20b, 20c, 20d mounted to the headboard or footboard structures 14 and 12 and the substrates to which they are associated with.

Figure 6:
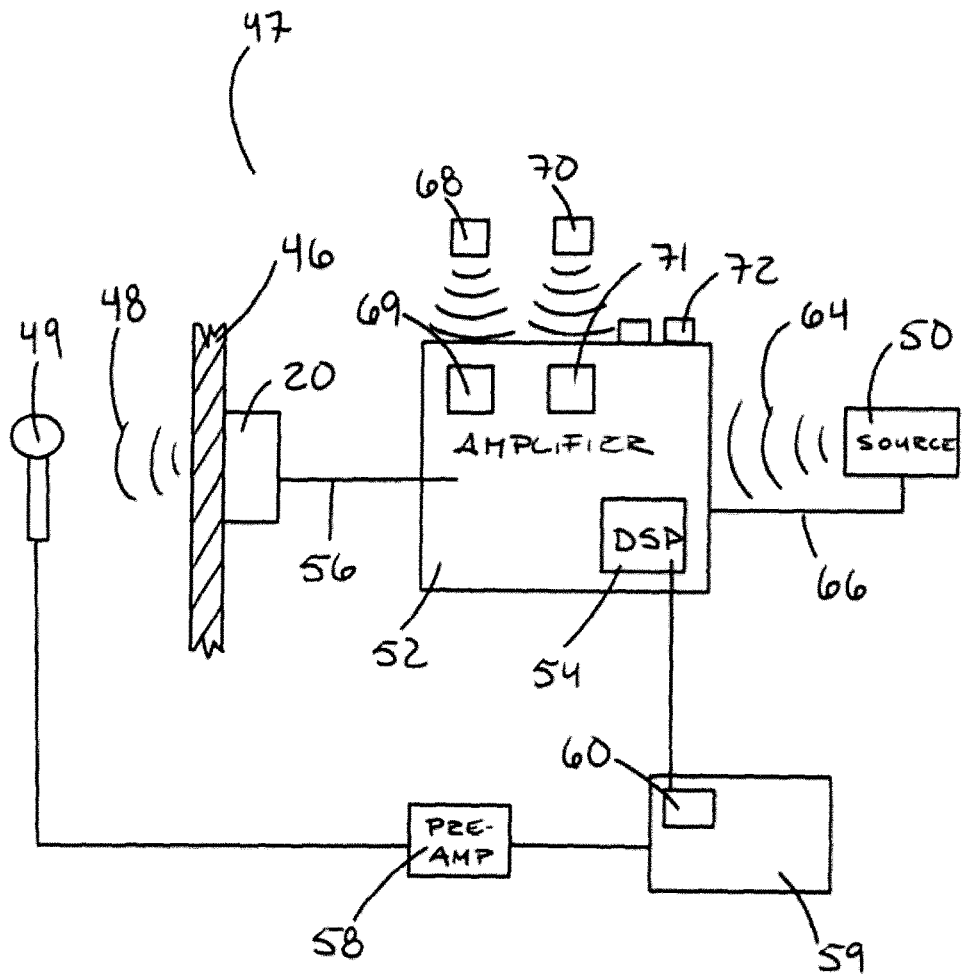
FIG. 6 is a schematic of the bed board audio system.

Referring to FIG. 6, a means for accomplishing this would be such as but not limited to the a headboard 14 which would be enhanced by an audio system 47 characterized by the following. At least one inertial acoustic actuator 20 is mounted to a substrate 46 affixed to headboard 14 or footboard 12. The inertial acoustic actuator 20 is driven by an audio signal through wire 56, which signal generates full bandwidth audio frequency sound commonly referred to as white or pink noise. This signal is transmitted by the audio amplifier 52 which would typically be supported by an on board digital sound processor (DSP) 54. A source 50 may produce the pink noise signal and send it commonly by a cable 66 to the amplifier 52. Sound waves 48 are the result. If any resonant frequencies are generated by the substrate 46 or materials in physical association with same, a sensitive microphone 49 will pick up and then send this output signal to a computer to analyze the audio spectrum produced by the substrate 46 and inertial type audio actuator 20. A preamplifier 58 amplifies the signal and sends it to a computer 59 utilizing a sound card 60 or other audio processing means and software capable of rendering a graphical representation of the sounds reproduced including resonant anomalies. The computer 59 or another computer not shown can also be connected to the amplifier 52 and its DSP 54 so as to program the DSP 54 with a new frequency equalization function which would then modify the incoming source 50 signal with the objective of pre-distorting, attenuating or compensating for resonant energy within the system and normalizing and optimizing the audio output of the system 47. Once the optimized signal pre-distortion parameters are attained by this measuring and modifying process, the new equalization parameters may be recorded to non-volatile memory on the DSP 54 so as to cause all source 50 audio signals sent to the amplifier 52 and then rendered to sound by the inertial audio actuator 20 affixed to the substrate 46 to be optimized without resonant characteristics.

The amplifier 52 may be controlled by a radio frequency control emitter 68 and radio frequency control receiver 69 on the amplifier. Alternatively the amplifier may be controlled by an infra red control emitter 70 coupled with an infra red control receiver 71 on the amplifier. Conventional amplifier mounted controls 72 may also be used.

The Source 50 may comprise of many different technologies or objects such as but not limited to MP3 players, radios, televisions, paging systems, emergency alerting systems or conventional audio reproduction systems. The source 50 may be connected to the audio amplifier by way of wireless radio frequency signal transmission means 64. Equally are wired transmission means 66 may connect the audio source 66 to the amplifier. This wired transmission means can be represented by but is not limited to Ethernet network cables, optical network cables or regular wire cables. If Ethernet cables are used, they may carry power to drive the amplifier as well as source signal, commonly know as Power Over Ethernet. The source information may form part of a local area network or may be connected to a simple single user source. It should also be noted that the audio amplifier 52 may be located remotely from the bed apparatus and joined to the transducer 20 by way of wire 56.

It would be obvious to someone skilled in the art that the footboard structure 12 may be configured in a like manner as the headboard structure 14 to function as an audio emitter. Equally it would also be obvious to someone skilled in the art that the furniture described in this patent need not only be restricted to a bed apparatus but may include other furniture which may support a person such as but not limited seating devices such as a couch, bench or chair, table and the like.

What I claim is:

1. A bed apparatus for a bed, the bed having a head end, a foot end and at least one bed board being disposed adjacent to an end of the bed, the at least one bed board comprising a first substantially planar substrate, a top side, a left side, a right side, a bottom side, and a second substantially planar substrate facing away from the bed, each of the first and second substrates extending toward each of said sides, the first substrate comprising an inside wall facing away from a center of the bed and an outside wall facing toward the center of the bed, the second substrate comprising an inside wall facing toward the center of the bed and an outside wall facing away from the center of the bed, the first and second substrates defining a hollow space there-between, wherein the bed apparatus comprises at least one inertial type acoustic transducer being coupled directly to any of the inside walls of the first and second substrates and being driven by an audio amplifier, the at least one inertial type acoustic transducer being configured to vibrate at audio frequencies to create bending waves on the substrate coupled to the transducer of the at least one bed board causing the substrate coupled to the transducer to radiate acoustic content and the bed board to act as a sound emitting element.

2. A bed apparatus as described in claim 1, wherein the audio amplifier is affixed to the one of the first and second substrates and within the hollow portion.

3. A bed apparatus as described in claim 1, wherein the first substrate defines a surface free of openings configured to allow sound to escape so as to facilitate cleaning of said bed board.

4. A bed apparatus as described in claim 1, wherein the at least one bed board is a headboard.

5. A bed apparatus as described in claim 1, the bed apparatus further comprising an ancillary multifunctional board generally adjacent to the at least one bed board and which has at least one inertial type acoustic transducer affixed thereon.

6. A bed apparatus as described in claim 1, wherein the audio amplifier receives audio source information by way of wired means.

7. A bed apparatus as described in claim 6, wherein said wired means are network wired Ethernet cables, or audio optical cables.

8. A bed apparatus as described in claim 1, wherein the audio amplifier receives audio source information by way of radio frequency means.

9. A bed apparatus as described in claim 1, wherein the audio amplifier may be tuned using parametric equalization to attenuate resonate frequencies or acoustic anomalies produced by the first and/or second substrate to which the at least one inertial type acoustic transducer is affixed to.

10. A bed apparatus as described in claim 1, wherein the bed apparatus is capable of emitting an emergency alarm audio signal.

11. A bed apparatus as described in claim 1, wherein a source signal is feeding the at least one inertial type acoustic transducer, the source signal being fed by wire from a remote amplifier.

12. A bed apparatus as described in claim 1, wherein the first and/or second substrate of the at least one bed board is free of focused audio point sources.

13. A bed apparatus as described in claim 1, wherein the at least one inertial type acoustic transducer is configured to deliver full audio spectrum acoustic content.

14. The bed apparatus as described in claim 1, the at least one bed board being adapted to be mounted to a room wall adjacent to one of the head end and foot end of the bed.

15. The bed apparatus as described in claim 14, the at least one bed board being adapted to be mounted to the room wall using audio vibration dampening mounting means.

16. The bed apparatus as described in claim 1, wherein the substrate of the at least one bed board is free of focused audio point sources.

* * * * *